US005686795A

United States Patent [19]

Sakoske et al.

[11] Patent Number: 5,686,795

[45] Date of Patent: Nov. 11, 1997

[54] FLUORESCENT LAMP WITH PROTECTED CATHODE TO REDUCE END DARKENING

[75] Inventors: George E. Sakoske, Mayfield Heights; Johnson M. Kachidza, Cleveland Heights; Richard C. Nagle, North Royalton, all of Ohio

[73] Assignee: General Electric Company, Schenectady, N.Y.

[21] Appl. No.: 546,855

[22] Filed: Oct. 23, 1995

[51] Int. Cl.[6] .............. H10J 61/10

[52] U.S. Cl. .............. 313/613; 313/242; 313/492

[58] Field of Search .............. 313/491, 492, 313/493, 240, 242, 613, 614

[56] References Cited

U.S. PATENT DOCUMENTS

| | | | |
|---|---|---|---|
| 2,244,070 | 6/1941 | Kurtz | 313/491 |
| 2,549,355 | 4/1951 | Winninghoff | 313/492 |
| 3,947,719 | 3/1976 | Ott | 313/110 |
| 4,093,893 | 6/1978 | Anderson | 313/492 |
| 4,142,125 | 2/1979 | Lauwerijssen et al. | 313/485 |
| 4,199,708 | 4/1980 | Lauweriujssen et al. | 313/493 |
| 4,204,137 | 5/1980 | Roy | 313/491 |
| 4,461,970 | 7/1984 | Anderson | 313/240 |
| 4,833,366 | 5/1989 | Wu et al. | 313/614 |
| 5,004,949 | 4/1991 | Latassa et al. | 313/492 |
| 5,233,268 | 8/1993 | Heuvelmans et al. | 313/491 |
| 5,274,299 | 12/1993 | Vegter | 313/293 |

*Primary Examiner*—Michael Horabik
*Assistant Examiner*—Michael Day
*Attorney, Agent, or Firm*—George E. Hawranko

[57] ABSTRACT

A low-pressure mercury vapor discharge lamp (10) includes a tubularly-shaped envelope (12) sealed at each end with a stem assembly (14). A fluorescent coating (26) is disposed on the interior surface of the envelope (12) and an electric discharge sustaining fill gas is provided within a hollow interior (24) of the envelope (12). Each stem assembly (14) includes a glass base portion (30) which seals the end of the envelope (12), an electrode (16), and a tubularly-shaped, light-transmissive, glass shield (22). The electrode (16) is disposed within the envelope (12) such that an electric discharge occurs between the electrodes (16) upon operation of the lamp (10). The glass shield (22) extends past the electrode (16) to partially surround the electrode (16) and shield the interior surface of the envelope (12) from material ejected from the electrode (16). The glass shield (22) allows the electric discharge to unaffectedly pass through an open end (42). Structural variations for supporting the glass shield (22) are also disclosed.

11 Claims, 2 Drawing Sheets

FLUORESCENT LAMP WITH PROTECTED CATHODE TO REDUCE END DARKENING

BACKGROUND OF THE INVENTION

1. Field of the Invention

The present invention generally relates to a low-pressure mercury vapor discharge lamp and, more particularly, to such a lamp having a glass shield partially surrounding the cathode to reduce end darkening.

2. Description of Related Art

Low-pressure mercury vapor discharge lamps having a phosphor layer for emitting visible light typically have electrodes made of coiled tungsten wire. The electrodes are coated with an emitter material for enhancing the thermionic emission of electrons. During operation of the lamp, emitter material and/or tungsten can evaporate or sputter from the electrodes and deposit on the lamp wall near the electrodes in the form of tungsten and tungsten products. This deposition of material on the lamp wall is evident as visible blackening or darkening at the ends of the lamp. The end darkening is detrimental to lamp operation because the deposits block a portion of the lamp wall, resulting in a loss of lumen output from the lamp. The end darkening may also be considered a cosmetic defect by a purchaser.

One technique for suppressing the end darkening is to partially surround each electrode with a shield or guard. The guard is in the form of a closed ring made of a conductive metal strip and positioned surrounding the sides of the electrode. The guard is typically mechanically supported on a mount that is electrically insulated from the supports of the electrode so that the guard is electrically "floating". These metallic guards, however, add several additional components to the lamp, are relatively expensive to produce, and are not easily adapted to high speed manufacturing. Accordingly, there is a need in the art for an improved fluorescent lamp having an electrode shield.

SUMMARY OF THE INVENTION

The present invention provides a low-pressure mercury vapor discharge lamp which overcomes at least some of the problems of the above-described related art. The lamp includes a sealed envelope having an interior surface and a fluorescent coating disposed on at least a portion of the interior surface. A discharge sustaining fill gas is within the hollow interior of the envelope. A pair of electrodes are disposed within the envelope between which an electric discharge occurs upon operation of the lamp and a pair of light-transmissive vitreous shields are disposed about the electrodes within the envelope. The shields partially surround the electrode to shield at least a portion of the envelope interior surface from material ejected from the electrodes. Each of the shields has an open end for allowing the electric discharge to pass unaffectedly therethrough.

BRIEF DESCRIPTION OF THE DRAWINGS

These and other features and advantages of the present invention will be apparent with reference to the following description taken in conjunction with the accompanying drawings, wherein.

DETAILED DESCRIPTION OF THE PREFERRED EMBODIMENTS

Figure 1:
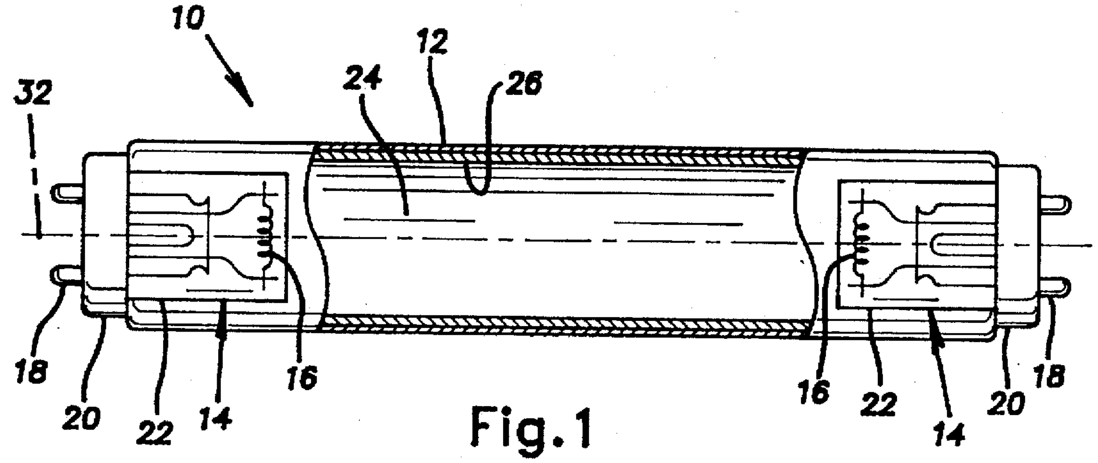
FIG. 1 is an elevational view of a fluorescent lamp constructed in accordance with the present invention.

Referring to FIG. 1, there is illustrated a low-pressure mercury vapor discharge lamp or fluorescent lamp 10 in accordance with the present invention. The lamp 10 includes an elongated soda-lime silicate glass discharge vessel or envelope 12 having a circular cross-section. It is noted that while the illustrated envelope 12 is generally straight, the envelope 12 can alternatively be convoluted to form a compact fluorescent lamp. Each end of the envelope 12 is hermetically sealed with a stem assembly 14 which includes an electrode 16 supported within the envelope 12. The electrode 16 is electrically connected to contacts 18 of a base 20 fixed at each end of the envelope 12. The stem assembly 14 also includes a separate glass shield 22 which encircles the electrode 16 between the electrode 16 and the envelope 12.

A hollow interior space 24 of the envelope 12 contains a low pressure, discharge sustaining, gaseous fill or fill gas such that an arc or electrical discharge is obtained between the electrodes 14 during operation of the lamp 10. The fill gas includes a small quantity of mercury in combination with an inert gas such as, for example, argon or a mixture of argon and other rare earth gasses. At least a portion of an interior surface of the envelope 12 is provided with a luminescent layer or phosphor coating 26 which includes at least one luminescent material which emits visible radiation upon excitation by ultraviolet radiation from the electrical discharge.

Figure 2:
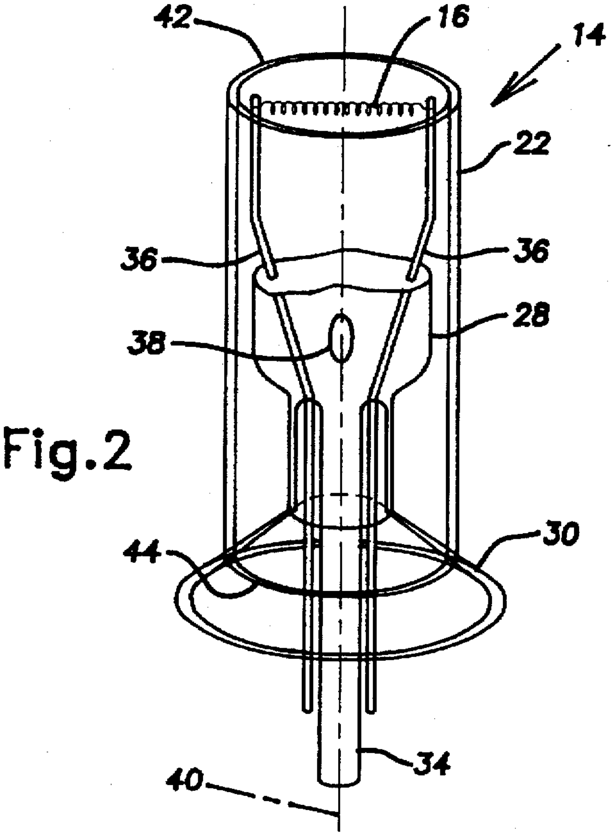
FIG. 2 is a perspective view of a stem assembly for a fluorescent lamp constructed in accordance with the present invention.

Referring to FIG. 2, there is illustrated the stem assembly 14 prior to assembly of the lamp. The stem assembly 14 includes a glass press seal portion 28 which is integrally connected to a glass base portion 30. The base portion 30 is sized and shaped such that when softened, it can be fixed or joined to the end of the envelope 12 to hermetically seal the envelope 12. It is noted that while the illustrated base portion 30 is a flare seal other configurations could be utilized within the scope of the present invention. As shown in FIG. 1, the stem assembly 14 is substantially coaxial with a central or longitudinal axis 32 of the envelope 12 after assembly of the lamp 10.

The stem assembly 14 also includes a tubulation or exhaust tube 34 and two current supply wires 36. The exhaust tube 34 extends from the pinch seal 28 and has a blow hole 38 to provide fluid communication between the interior of the exhaust tube 34 and the interior of the envelope 12 when the stem assembly 12 is fixed to the end of the envelope 12. The exhaust tube 34 is closed-off or tipped once the envelope 12 has been exhausted and/or charged with the fill gas. The current supply wires 36 support the electrode 16 and are sealed in the pinch seal 28 so that, when the lamp 10 is assembled, the current supply wires 36 extend from the inside to the outside of the envelope 12 in a hermetically sealed manner. After assembly of the lamp 10, the current supply wires 36 electrically connect the ends of the electrode 16 to the contacts 18 of the base 20.

The electrode 16 is supported in a transverse manner, that is, a central or longitudinal axis of the electrode is substantially perpendicular to a central or longitudinal axis of the stem assembly 40. The electrode 16 is typically a tungsten coiled electrode wherein turns of the electrode 16 are coated with an emitter material for enhancing the thermionic emission of electrons.

The glass shield 22 is generally tubularly-shaped and is substantially coaxial with the central axis 40 of the stem assembly 14. The glass shield 22 is either integrally formed with the base portion 30 or alternatively is formed as a separate component and joined or attached to the base portion 30. If the glass shield 22 and the base portion 30 are formed separately, they can be easily joined because the glass shield 22 and the base portion 30 are each made from glass, the glass shield 22 and the base portion 30 can be softened with heat and joined.

The glass shield 22 longitudinally extends from the base portion 30 past the electrode 16 such that the electrode 16 is within the glass shield 22. The glass shield 22 passes between the electrode 16 and the envelope 12 to shield the interior surface of the envelope 12 from emitter material ejected from the electrode 16 during operation of the lamp 10. The glass shield 22 extends past the electrode 16, in a direction of the electric discharge, a distance effective for substantially reducing, and preferably eliminating, end darkening of the envelope 12 caused by the accumulation of emitter material on the interior surface of the envelope 12. The distance the glass shield 22 extends beyond the electrode 16, however, is preferably optimized to both minimize the total length of the stem assembly 14 and substantially reduce the end darkening. The distance is preferably in the range of about 2 mm to about 10 mm.

The glass shield 22 has an inner diameter sized for encircling the transversely extending electrode 16 and an outer diameter sized to fit within the envelope 12. The end 42 of the glass shield 22, opposite the end 44 fixed to the base portion 30, is completely open to allow the electric discharge to pass therethrough without being affected by the glass shield 22, that is, the end 42 of the glass shield 22 is clear such that none of the electrical discharge between the electrodes 16 is blocked or intercepted. The glass shield 22 is also light-transmissive, that is, the glass shield 22 passes both ultraviolet and visible radiation such that the radiation produced by the electric discharge and passing through the glass shield 22 is substantially unaffected optically by glass shield 22. Therefore, the glass shield 22 is free of any optical coatings or filters.

Figure 3:
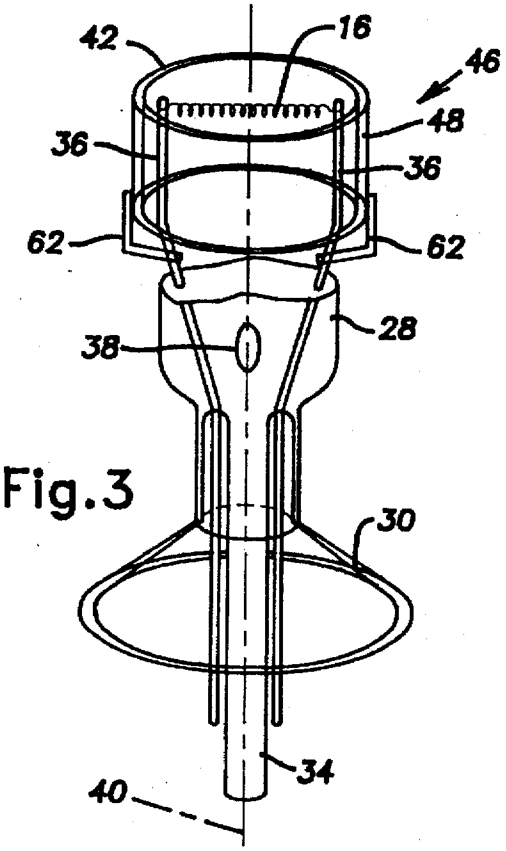
FIG. 3 is a perspective view of a first variation of the stem assembly of FIG. 2.
Figure 4:
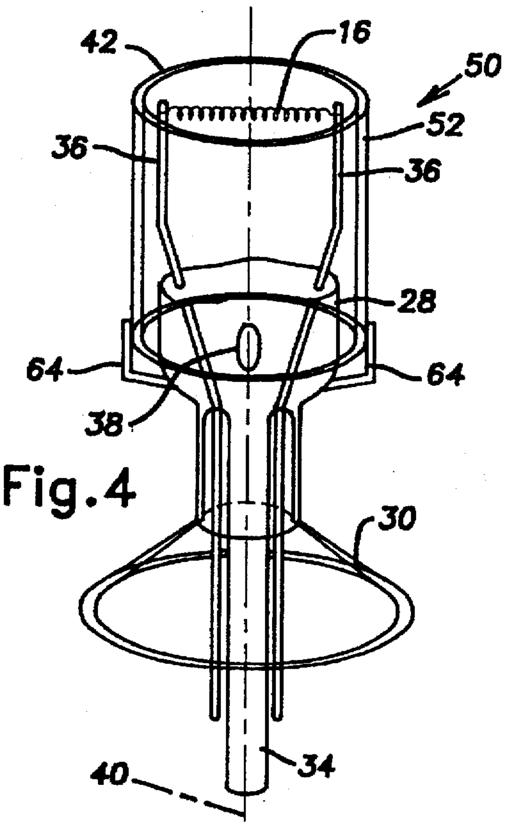
FIG. 4 is a perspective view of a second variation of the stem assembly of FIG. 2.

FIGS. 3–6 illustrate variations of the stem assembly 14 of FIG. 2, wherein like structural items use like reference numerals. FIGS. 3 and 4 illustrate stem assemblies 46, 50 similar to the stem assembly 14 of FIG. 2 except that tubularly-shaped glass shields 48, 52 are provided which are shorter in length and held in place by support elements 62, 64 rather than the base portion 30. The glass shield 48 of the stem assembly 46 of FIG. 3 extends from between the pinch seal 28 and the electrode 16 to beyond the electrode 16. The support elements 62 of the stem assembly 46 of FIG. 3 are, for example, metallic wires and are fixed between the glass shield 48 and the current supply wires 36 to support the glass shield 48 in position. The glass shield 52 of the stem assembly 50 of FIG. 4 extends from the pinch seal 28 to beyond the electrode 16. The support elements 64 of the stem assembly 50 of FIG. 4 are also, for example, metallic wires and are fixed between the glass shield 52 and the pinch seal 28 to support the glass shield 52 in position.

Figure 5:
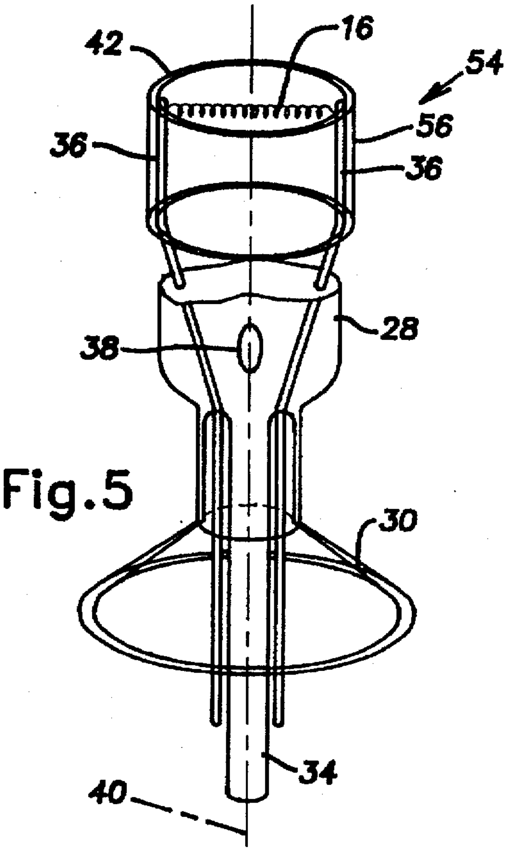
FIG. 5 is a perspective view of a third variation of the stem assembly of FIG. 2.
Figure 6:
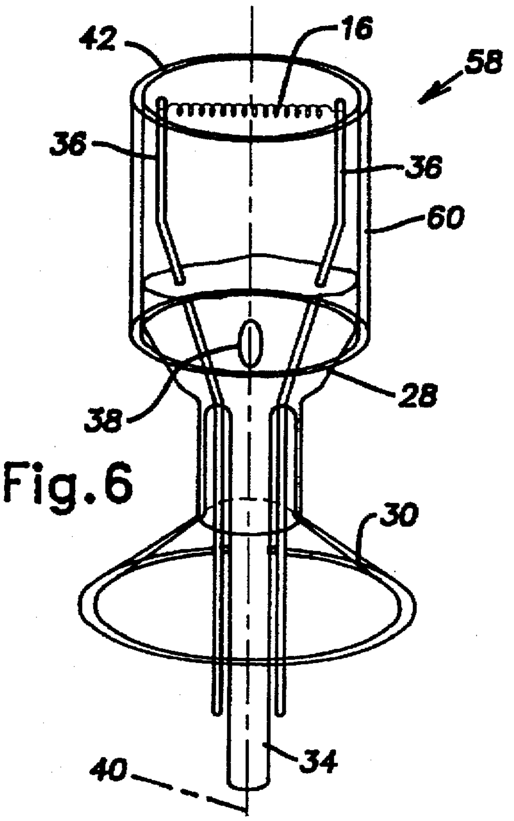
FIG. 6 is a perspective view of a fourth variation of the stem assembly of FIG. 2.

FIG. 5 illustrates a stem assembly 54 similar to the stem assembly 14 of FIG. 2 except that a tubularly shaped glass shield 56 is provided which is shorter in length and is fixed directly to the current supply wires 36 rather than fixed to the base portion 30. The glass shield 56 of the stem assembly 54 of FIG. 5 extends from between the pinch seal 28 and the electrode 16 to beyond the electrode 16. The glass shield 56 is preferably directly fixed or attached to the current supply wires 36 by softening the glass shield 56 with heat and pinching it onto the current supply wires 36. FIG. 6 illustrates a stem assembly 58 similar to the stem assembly 14 of FIG. 2 except that a tubularly shaped glass shield 60 is provided which is shorter in length and is attached or joined directly to the pinch seal 28 rather than fixed to the base portion 30. The glass shield 60 of the stem assembly 58 of FIG. 6 extends from the pinch seal 28 to beyond the electrode 16. The glass shield 60 is preferably directly joined to the pinch seal 28 by softening the glass shield 60 and the pinch seal 28 with heat and pinching the glass shield 60 onto the pinch seal.

It is noted that in each of the stem assembly variations 46, 50, 54, and 58, the glass shield 48, 52, 56, and 60 extends past the electrode 16 a distance in each direction which is effective for substantially reducing, and preferably eliminating, end darkening of the envelope 12 caused by the accumulation of emitter material on the interior surface of the envelope 12.

From the above, it can be seen that a lamp in accordance with the present invention is relatively inexpensive to produce because glass is a relatively inexpensive material and lamp manufacturers typically already have the required production capabilities for producing glass tubes. Additionally, the total number of lamp components is minimized because the glass shield can be directly joined to existing metal or glass components and also because the glass shield does not require isolation from the electrode 16 or the current supply wires 36. Furthermore, the lamp 10 allows for inexpensive high volume manufacturing.

Although particular embodiments of the invention has been described in detail, it will be understood that the invention is not limited correspondingly in scope, but includes all changes and modifications coming within the spirit and terms of the claims appended hereto.

What is claimed is:

1. A low-pressure mercury vapor discharge lamp comprising:

a sealed envelope having an interior surface;

a fluorescent coating disposed on at least a portion of said interior surface;

a discharge sustaining gas fill within said envelope;

a pair of electrodes disposed within said envelope between which an electric discharge occurs upon operation of the lamp; and a pair of light-transmissive vitreous shields disposed about said electrodes within said envelope for shielding at least a portion of said envelope interior surface from material ejected from said electrodes, each of said shields having an open end for allowing the electric discharge to pass therethrough, wherein said shields are sized and shaped such that a path of the electric discharge between said electrodes is unaffected by said shields.

2. The low-pressure mercury vapor discharge lamp according to claim 1, wherein said shields extend past said electrodes a distance in the range of about 2 mm to about 10 mm in a direction of the electric discharge.

3. The low-pressure mercury vapor discharge lamp according to claim 1, wherein radiation produced by the electric discharge and passing through said shields is substantially unaffected optically by said shields.

4. A low-pressure mercury vapor discharge lamp comprising:

a sealed envelope having an interior surface;

a fluorescent coating disposed on at least a portion of said interior surface;

a discharge sustaining gas fill within said envelope;

a pair of electrodes disposed within said envelope between which an electric discharge occurs upon operation of the lamp;

a pair of light-transmissive vitreous shields disposed about said electrodes within said envelope for shielding at least a portion of said envelope interior surface from material ejected from said electrodes, each of said shields having an open end for allowing the electric discharge to pass therethrough; and a pair of stem assemblies each sealing an end of said envelope and supporting one of said shields and one of said electrodes.

5. The low-pressure mercury vapor discharge lamp according to claim 4, wherein each of said stem assemblies has a glass base portion for sealing the envelope and said shield is integral with said base portion.

6. The low-pressure mercury vapor discharge lamp according to claim 4, wherein each of said stem assemblies has a glass base portion for sealing the envelope and said shield is joined directly to said base portion.

7. The low-pressure mercury vapor discharge lamp according to claim 4, wherein each of said stem assemblies includes a pair of current supply wires connected to the electrode and support elements fixed to said shield and said current supply wires.

8. The low-pressure mercury vapor discharge lamp according to claim 4, wherein each of said stem assemblies includes a glass pinch seal for sealing current supply wires connected to the electrode and support elements fixed to said shield and said pinch seal.

9. The low-pressure mercury vapor discharge lamp according to claim 4, wherein each of said stem assemblies includes a pair of current supply wires connected to the electrode and said shield is fixed directly to said current supply wires.

10. The low-pressure mercury vapor discharge lamp according to claim 4, wherein each of said stem assemblies includes a glass pinch seal for sealing current supply wires connected to the electrode and said shield is fixed directly to said pinch seal.

11. The low-pressure mercury vapor discharge lamp according to claim 1, wherein said shields are straight tubes.

* * * * *